(12) United States Patent
Perthold et al.

(10) Patent No.: US 6,621,340 B1
(45) Date of Patent: Sep. 16, 2003

(54) SYSTEM FOR REDUCING ADJACENT-CHANNEL INTERFERENCE BY PRE-LINEARIZATION AND PRE-DISTORTION

(75) Inventors: Rainer Perthold, Weisendorf (DE); Heinz Gerhaeuser, Waischenfeld (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/111,760

(22) PCT Filed: Feb. 24, 2000

(86) PCT No.: PCT/EP00/01539
§ 371 (c)(1), (2), (4) Date: Apr. 29, 2002

(87) PCT Pub. No.: WO01/63750
PCT Pub. Date: Aug. 30, 2001

(51) Int. Cl.[7] .................................................. H03F 1/26
(52) U.S. Cl. ........................ 330/149; 330/129; 330/136; 375/297
(58) Field of Search ............................ 330/149, 129, 330/136, 151; 327/317, 551; 375/297

(56) References Cited

U.S. PATENT DOCUMENTS

| | | | |
|---|---|---|---|
| 4,462,001 A | | 7/1984 | Girard |
| 4,465,980 A | | 8/1984 | Huang et al. |
| 4,706,287 A | * | 11/1987 | Blackmer et al. ............ 351/17 |
| 5,023,937 A | | 6/1991 | Opas |
| 5,049,832 A | * | 9/1991 | Cavers ........................ 330/149 |

FOREIGN PATENT DOCUMENTS

| | | | |
|---|---|---|---|
| DE | 33 12 030 A1 | 10/1983 | |
| DE | 196 31 388 A1 | 1/1998 | |
| DE | 19927952 | * 6/1999 | ............ 330/149 |
| EP | 0 312 261 A2 | 4/1989 | |
| EP | 0 608 697 A1 | 8/1994 | |
| EP | 0 658 975 A1 | 6/1995 | |
| GB | 2 240 893 A | 8/1991 | |
| WO | WO 93/18581 | 9/1993 | |

OTHER PUBLICATIONS

M. Ghaderi, S. Kumar and D.E. Doods, Fast Adaptive Polynomial I and Q Predistorter with Global Optimisation, IEEE Proceedings: Communication vol. 143, No. 2, Apr. 1, 1996, pp. 78–86.

* cited by examiner

Primary Examiner—Henry Choe
(74) Attorney, Agent, or Firm—Dougherty, Clements & Hofer

(57) ABSTRACT

A circuit for reducing adjacent-channel interference by pre-linearizing and pre-distorting an input signal to be transmitted via a power amplifier having a non-linear transmission characteristic is disclosed. A portion of the input signal exceeding a dynamic range of the power amplifier is determined and expanded along the time axis to produce an expanded version thereof. The expanded version and the input signal are combined, such that the expanded version is subtracted from the input signal, to produce a pre-linearized signal. The circuit further has a pre-distorting unit for pre-distorting the pre-linearized signal using complex pre-distortion coefficients, such that the distortion introduced by the non-linear transmission characteristic of the power amplifier is substantially compensated for according to magnitude and phase.

24 Claims, 6 Drawing Sheets

SYSTEM FOR REDUCING ADJACENT-CHANNEL INTERFERENCE BY PRE-LINEARIZATION AND PRE-DISTORTION

BACKGROUND OF THE INVENTION

1. Field of the Invention

The present invention relates to systems for conducting a pre-treatment, i.e., a pre-linearization and a pre-distortion, of an input signal to be transmitted via a non-linear amplifier, in particular a power amplifier, in order to compensate for level-dependent non-linearities of the gain of the amplifier.

The present invention can be used for conducting a pre-treatment of input signals formed using modulation methods which result in a non-constant envelope of the radio frequency carrier signal. Thus, the present invention preferably finds use in transmitters for digital broadcasting, which are fed by multi-carrier signals, such as OFDM signals (OFDM=orthogonal frequency division multiplex), for example. With such signals, the non-linearity of the amplifier causes unwanted frequency portions of the signal at the output of the amplifier. Such frequency portions interfere with adjacent-frequency channels.

In addition, the present invention is applicable to mobile communication systems using CDMA signals (CDMA=code division multiple access), for example. Additionally, the present invention can be advantageously used in satellite earth stations or base stations of mobile telephone systems.

When pulse amplitude modulation methods are used, the spectral efficiency will deteriorate due to the non-linearity of the amplifiers. The reason for this is to be seen in the non-linear amplitude output characteristics of an amplifier, which leads to an AM/AM conversion; the phase drift of an output signal of an amplifier relative to the phase of an input signal produces, in addition, intermodulation components, which is also referred to as AM/PM conversion. The AM/AM and the AM/PM conversion must, however, be prevented by suitable linearization methods. If this is not done, the spectral efficiency of the modulation method used as well as the signal-to-noise ratio will deteriorate. In digital transmission systems this can cause a substantial increase in the bit error rate during the transmission.

2. Description of Prior Art

A plurality of methods for linearizing radio frequency final stages in order to reduce spurious adjacent-channel emission at the output thereof already exist in the field of technology. The best-known methods of linearizing radio frequency final stages can be classified as follows.

When a signal to be transmitted is digitally pre-distorted, the digitally represented values of the signal are multiplied by suitably selected coefficients. Hence, the pre-distortion is carried out together with the digital generation of the control signal of the modulator.

A further known method is the analog pre-distortion. It makes use of non-linear components, such as Schottky diodes, so as to synthesize an equalizing characteristic which is complementary to the amplifier distortion characteristic.

The "Cartesian loop" represents an analog negative feedback of the radio frequency final stage, which is carried out in the baseband.

The forward coupling (also referred to as "feedforward" in the field of technology) constitutes a disturbance variable feedforward in the sense of control technology, the output signal of the final stage having added thereto a suitable correction voltage for compensating the distortion of the final stage.

WO 93/18581 describes a "cartesian loop" whose parameters are adjusted in accordance with various system parameters which are representative of the current operating condition of the system. A radio transmitting unit according to said WO 93/18581 comprises a power amplifier, a linearization means and a feedback means for feeding a signal back from an output of the power amplifier to the linearization means so as to guarantee the linearity of the output signal. The linearization means operates in the baseband, the IQ signals being controlled by a linear control means which is connected to a direct-access table storing predetermined loop linearization parameters. When the IQ signals have been processed in a suitable manner by the linearization means, these processed signals are subjected to up-conversion by an up-conversion mixer whereupon they are amplified by the power amplifier. The feedback means takes an output signal of the power amplifier, subjects it to down-conversion by means of a down-conversion mixer and feeds the down-converted signal into the linearization means.

GB 2240893 A discloses a circuit for linearizing the amplitude response and the phase response of an amplifier. An envelope detection circuit detects the envelope of an input signal to be transmitted, the output signal of said envelope detection circuit being inputted in a control circuit of the non-linear type as well as in a phase shift control circuit. The phase shift control circuit controls a phase shifter which precedes the power amplifier for pre-distorting the radio frequency signal with regard to its phase. The control circuit of the non-linear type feeds an input signal into a variable-voltage dc-dc converter which adjusts the bias voltage parameters, i.e. the operating point of the power amplifier in a suitable manner so as to compensate the distortion of the non-linear amplifier. The amplitude error of the amplifier is therefore compensated for by adjusting the operating point of said amplifier, a course of action which is disadvantageous insofar as the operating point parameters of the amplifier will have to be changed constantly, and this may it make much more difficult to adapt the amplifier to a load, since, normally, a changed operating point will automatically require a different (complex) transformation ratio of the output resistance.

U.S. Pat. No. 5,023,937 represents an analog pre-distortion circuit for a power amplifier operated in the non-linear region. This pre-distortion works by means of a negative feedback loop in which, in contrast to the Cartesian loop, not the IQ components of the output signal are controlled, but the amount and the phase of said output signal. An envelope detector detects the amplitude of the signal to be amplified, said amplitude being continuously compared, with regard to its feedback, with the envelope of the output signal of the power amplifier, the comparison result being applied to a variable attenuator which attenuates the input signal before the power amplifier in a suitable manner so as to produce an output signal which is as linear as possible. The phase pre-distortion is carried out by means of a phase locked loop receiving the signal to be amplified as an input signal. A part of the output signal of the amplifier is also inputted in the phase locked loop by means of a mixer, a local oscillator and a phase shift circuit, said phase locked loop supplying a local oscillator signal for a mixer preceding the power amplifier in order to suitably pre-distort the phase of the signal to be amplified. This circuit operates in a fully analogous manner and is based on a substantially continuous feedback, if the phase locked loop is locked.

Also U.S. Pat. No. 4,465,980 represents an analog pre-distortion circuit. A detector detects the envelope of a signal to be amplified and applies this signal to a field effect transistor with two gate terminals ("dual gate FET"). The signal to be amplified is applied to the other gate of the dual gate FET. The radio frequency input signal is suitably pre-distorted by controlling the operating point of this dual gate FET in a suitable manner so as to compensate the non-linear amplification of a power amplifier connected to the drain terminal of said dual gate FET via a matching network.

DE 3312030 A1 discloses an amplifier with pre-distortion compensation, which uses pre-distortion components produced by a power amplifying element, which is similar to the amplifying element, so as to achieve an effective linearization for substantially reducing all intermodulation distortion products. Furthermore, an additional feedback circuit can be provided so as to achieve a further reduction of non-linearities.

GB 8723874 discloses a linearity correction circuit operating in an intermediate frequency region so as to introduce a suitable pre-distortion in an amplitude envelope for compensating the non-linearity of the power amplifier stages. An array of parallel current sources, each of which is adapted to be adjusted in response to a predistortion over a respective amplitude band, feeds a current which is sufficient for introducing a suitable differential voltage at the output. In this circuit, a phase pre-distortion does apparently not take place.

EP 0 658 975 A1 refers to a baseband pre-distortion system for the adaptive linearization of power amplifiers and to a radio transmitter making use of the pre-distortion system. In so doing, two error tables, viz. one for the amplitude and one for the phase, are updated, the content of said tables being used for correcting the baseband sampling values. The content of the tables is obtained by accumulating a suitable weighted difference between sampling values which are inputted in the pre-distortion unit and a demodulated feedback value.

EP 0 608 697 A1 discloses a modulation method and a modulation circuit for radio frequency signals. In the case of this modulation method and modulation circuit, the LF modulation signals, which are modulated upon an HF carrier by means of a complex IQ modulation, are pre-distorted in the LF region in such a way that tolerances of the HF components of the modulator, i.e. of the 0ø to 90ø hybrid and of the mixers, which cause unbalances between the I and the Q branch, are compensated for. The predistortion of the LF modulation signals guarantees that e.g. in the case of a single-sideband modulation the carrier and the undesired sideband are sufficiently suppressed.

The technical publication IEE Proceedings: Communications, Vol. 143, No. 2, Apr. 1, 1996, pp. 78–86, Ghaderis M. et al, "Fast Adaptive Polynomial I and Q Pre-distorter with Global Optimization", with regard to which the independent claims have been limited, discloses a linearization structure for a radio frequency amplifier, the pre-distortion being implemented on the intermediate frequency. For this purpose, the envelope of an intermediate frequency signal is detected and quantized in the case of a digital implementation. Furthermore, a lookup table for implementing amplification functions is addressed, an analog implementation being, however, preferred to make things easier. These amplification functions represent the inverse non-linearities of the radio frequency power amplifier whose non-linearities are approximated by means of polynomial functions. An IQ modulator causes a pre-distortion of the LF signal, the IQ modulation signals depending on the amplification functions and the envelope of the IF signal.

DE 19 631 388 A1 relates to a radio frequency pre-distortion system for a non-linear channel, wherein the envelope of a signal to be transmitted via a non-linear channel is detected and wherein quantized envelope values are generated. Complex pre-distortion coefficients are stored in a table, the complex pre-distortion coefficients depend on the quantized envelope values and on the transmission function of the non-linear channel which is determined in advance. An IQ modulator is provided for modulating the signal to be transmitted using the complex pre-distortion coefficients before the signal is transmitted via the non-linear channel. The modulation is performed such that the distortion introduced by the non-linear channel is substantially compensated according to magnitude and phase. The above system using a pre-distortion in the radio frequency range rarely provides an adequate compensation because of interference signal portions in channels immediately adjacent to the usable channel. Thus, high demands are made on the bandpass filter connected to the output of the non-linear channel, i.e., the non-linear power amplifier.

U.S. Pat. No. 5,049,832 describes a system for amplifier linearization by adaptive pre-distortion. According to U.S. Pat. No. 5,049,832, squared magnitude values of a complex base-band signal are derived. Based on the squared magnitude values, a look-up table is accessed. Each table entry of the look-up table corresponds to a squared magnitude value. The table entries for respective squared magnitude values are set to provide pre-distortion for the input signal which compensates for level-dependent non-linearities of the gain of the amplifier. For any input power, the optimum value of the complex gain of the pre-distortion, i.e., the table entries, is determined by equating the composite pre-distorter/power amplifier non-linearity to a nominal constant amplitude gain of the power amplifier. The complex base-band signal is pre-distorted by the table entries, and the pre-distorted input signal is applied to the power amplifier. The pre-distorted input signal is obtained using complex multiplication of the complex input signal by the complex table entries. The system described in U.S. Pat. No. 5,049,832 suffers from the disadvantage that the linearization gain, i.e., the reduction of unwanted spurious emission in the channels immediately adjacent to the useful channel, will strongly decrease if the crest factor of the RF signal exceeds the back-off of the dynamic range of the amplifier, i.e., the reserve of the dynamic range of the amplifier. The crest factor of OFDM signals normally exceeds the back-off of the dynamic range of the power amplifier used in the output stage of a digital broadcast transmitter.

SUMMARY OF THE INVENTION

It is the object of the present invention to provide an apparatus and a method for further reducing spurious emission in channels adjacent to a useful channel of a radio frequency final stage.

According to a first aspect of the invention, this object is achieved by a circuit for reducing adjacent-channel interference by pre-linearizing and pre-distorting an input signal to be transmitted via a power amplifier having a non-linear transmission characteristic and a limited dynamic range, wherein the circuit has the following features:

a pre-linearization signal generation unit for producing a pre-linearization signal reflecting a signal portion of said input signal exceeding the dynamic range of said power amplifier;

an element for expanding said pre-linearization signal along the time axis to produce an expanded pre-linearization signal reflecting an expanded version of said signal portion of said input signal exceeding said limitation;

an element for combining said expanded pre-linearization signal and said input signal, such that said expanded version of said signal portion of said input signal exceeding said limitation is subtracted from said input signal, to produce a pre-linearized signal;

a pre-distorting unit for pre-distorting said pre-linearized signal using complex pre-distortion coefficients which depend on the power of said input signal or the power of said pre-linearized signal and the non-linear transmission characteristic of said power amplifier determined in advance, such that the distortion introduced by the non-linear transmission characteristic of said power amplifier is substantially compensated for according to magnitude and phase.

According to a second aspect of the invention, the above object is achieved by a method for reducing adjacent-channel interference by pre-linearizing and pre-distorting an input signal to be transmitted via a power amplifier having a non-linear transmission characteristic and a limited dynamic range, comprising the steps of:

producing a pre-linearization signal reflecting a signal portion of said input signal exceeding the dynamic range of said power amplifier;

expanding said pre-linearization signal along the time axis to produce an expanded pre-linearization signal reflecting an expanded version of said signal portion of said input signal exceeding said limitation;

combining said expanded pre-linearization signal and said input signal, such that said expanded version of said signal portion of said input signal exceeding said limitation is subtracted from said input signal, to produce a pre-linearized signal;

pre-distorting said pre-linearized signal using complex pre-distortion coefficients which depend on the power of said input signal or the power of said pre-linearized signal and the non-linear transmission characteristic of said power amplifier determined in advance, such that the distortion introduced by the non-linear transmission characteristic of the power amplifier is substantially compensated for according to magnitude and phase.

According to the present invention, a pre-distorting unit, preferably comprising an estimator, a table containing complex pre-distortion coefficients and a pre-distorter is used along with a pre-linearizing unit using a time-dispersive element (for producing a pre-linearization signal expanded in the in direction of the time axis) in order to conduct a pre-treatment of a signal to be transmitted via a power amplifier of an RF output stage. The pre-distorting unit is not able to handle spurious emission in channels adjacent to the useful channel due to cutting-off of signal portions of the input signal exceeding the dynamic range of the power amplifier by the power amplifier. In order to reduce such spurious emission mentioned above, the time dispersive linearization means for producing the pre-linearized signal is provided according to the present invention.

The inventors recognized that it is not sufficient to produce a pre-linearized signal by limiting the input signal to an upper limitation corresponding to a boundary of the dynamic range of the power amplifier, since purely cutting-off single portions exceeding the upper limitation would produce sharp edges in the input signal, such that spurious adjacent-channel emission in the output of the power amplifier cannot be satisfactory obtained. Thus, according to the present invention, an element for expanding the pre-linearization signal reflecting that signal portion of the input signal exceeding the limitation is provided. Such element is preferably a bandpass filter or a lowpass filter. By expanding the pre-linearization signal to be subtracted from the input signal along the time axis, interference signal portions in the frequency spectrum of the output of the power amplifier adjacent to the useful channel are shifted into a spectral range spaced from the frequency range of the useful signal, i.e., the useful channel.

With respect to a pre-linearization using a time dispersive element, reference is made to the non-prepublished German patent application 19927952.7-35 which goes back to the applicant of the present application. DE 199 27 952.7 relates to a system for conducting a pre-linearization of an input signal to be transmitted via a power amplifier of an RF output stage wherein an estimator produces a fault signal by estimating a fault caused by the non-linearity of the power amplifier. The fault signal is expanded in the direction of the time axis in order to produce a correction signal. The correction signal is subtracted from the signal to be transmitted. By expanding the fault signal in the direction of the time axis, the interference signal portion due to the non-linearity of the power amplifier is shifted away from the useful frequency range in the frequency spectrum of the output signal of the non-linear power amplifier. However, it has been found that such a pre-linearization using a time dispersive element, i.e., an element which expands a signal into the direction of the time axis, will not provide satisfactory results if the input signal of an amplifier having high phase distortions, travelling-wave tubes for example, should be pre-linearized. In such a case, the linearization gain of the linearization means using a time dispersive element is substantially reduced.

The present application is based on a combination of a pre-distorting unit, such as described in U.S. Pat. No. 5,049,832, for example, and a pre-linearizing unit using a time dispersive element. The combination of power amplifier and pre-distorting unit represent a so-called "soft limiter", i.e., an amplifier having a constant gain up to the boundary of the dynamic range and a hard limitation beyond the upper boundary of the dynamic range. Thus, the limiter used in the inventive circuit for reducing adjacent-channel interference and the combining element for producing the pre-linearization signal reflecting a signal portion of the input signal exceeding the limitation represent an estimator for producing a fault signal being an estimation of the fault produced by the power amplifier after non-linearities inside the dynamic range thereof have been addressed by the pre-distorting unit.

In preferred embodiments of the present invention, the limiter of the inventive circuit comprises an estimator for determining an estimation signal based on the power of the input signal, a table for storing real coefficients, wherein the real coefficients depend on the estimation signal and the upper boundary of the dynamic range of the power amplifier, and an element for applying the real coefficients to the input signal such that the limited input signal is produced. Thus, the limiter imitates the performance of the power amplifier in that it estimates the output signal of the power amplifier on the basis of the input signal and real coefficients stored in a table. The real coefficients inside the dynamic range of the power amplifier are constant greater than zero, and are preferably one. Beyond the dynamic range of the power amplifier, the real coefficients are adjusted such that the magnitude of the output of the element for applying the real coefficient to the input signal, preferably a multiplier, is held on a constant value, irrespective of the input signal.

It is not necessary to have real coefficients and imaginary coefficients in the table of the limiter, since phase distortions are addressed by the pre-distorting unit, rather than by the pre-linearizing unit.

In a first embodiment of the present invention, the pre-linearizing unit, i.e., the unit for producing a pre-linearized signal using a time dispersive element and the pre-distorting unit are connected in series, wherein the output of the pre-linearizing unit is connected to the input to the pre-distorting unit.

In a second embodiment of the present invention, the pre-linearizing unit and the pre-distorting unit are "interleaved" wherein the pre-linearizing unit and the pre-distorting unit use the same input signal such that the same estimator can be shared by the pre-distorting unit and the pre-linearizing unit. The second embodiment accepts an approximation with attendant fault. However, it provides a satisfactory reduction of adjacent-channel interference using a time dispersive linearizing unit even in the case of highly non-linear amplifiers. According to the second embodiment, a single estimator is required, contrary to two estimators in case of a simple series connection. Therefore, four multipliers will be saved if a means for deriving the sum of squares of the absolute value of the real and the imaginary parts of the input signal is used as the estimator. Thus, the second embodiment provides an inexpensive solution when compared with a simple series connection of the pre-linearizing unit and the pre-distorting unit.

The inventive circuit for reducing adjacent channel interference is preferably adaptive in that means are provided in order to adapt the coefficients in the tables of the pre-distorting unit and/or the pre-linearizing unit to take changes of the transmission characteristics of the power amplifier into account. Such changes of the transmission characteristics of the power amplifier can take place because of ageing, temperature changes, and so on, for example.

As mentioned above, the time dispersive element is preferably a time dispersive bandpass filter or lowpass filter which reshapes short interference pulses in longer interference pulses in order to effect an expansion of the pre-linearization signal in the direction of the time axis. Filter coefficients of the bandpass filter and the lowpass filter, respectively are preferably determined based on the transmission characteristic of the non-linear power amplifier. To this end, the spectral power of the output signal of the power amplifier can be measured and the power in the channels adjacent to the useful channel can be used as criteria for optimizing the filter coefficients. For such an optimization, known algorithms can be used, the simplex algorithm, for example. It should be clear that any time dispersive element effecting an expansion of the estimated pre-linearization signal can be used apart from the bandpass filter and the lowpass filter mentioned above.

In particular, the present invention is useful for a pre-treatment of signals which have been subjected to a multi-carrier modulation. However, the present invention can be used in connection with other signals comprising high crest factors, CDMA signals, for example.

The present invention is preferably performed on a digital input signal in the base-band region. However, the principles of the present invention can be applied to analog input signals in the form of complex envelopes as well. Moreover, the principles of the present invention also apply for analog signals in the RF region. Thus, the term "signal" used herein is destined to encompass the kinds of signal mentioned above wherein respective adaption of the methods and apparatus described with respect to the preferred embodiments of the present invention are obvious for those skilled in the art.

Therefore, the present invention provides apparatus and method which will permit improved reduction of adjacent channel interference even in case of RF signals having a crest factor which exceeds the back-off of the dynamic range of the power amplifier and even in case of power amplifiers having high phase distortions, travelling-wave tubes, for example. According to the present invention, interference signal portions at the output of the power amplifier are as low as possible. Moreover, interference signal portions in the output signal of the power amplifier are shifted away from channels adjacent to the useful channel toward channels spaced from the useful channel.

BRIEF DESCRIPTION OF THE DRAWINGS

Preferred embodiments of the present invention are described hereinafter referring to the appended drawings, in which.

DESCRIPTION OF PREFERRED
EMBODIMENTS OF THE INVENTION

In the following, preferred embodiments of the present invention are described referring to a complex digital input signal which will be applied to a power amplifier via a digital-to-analog converter and an upconverter.

Figure 1:
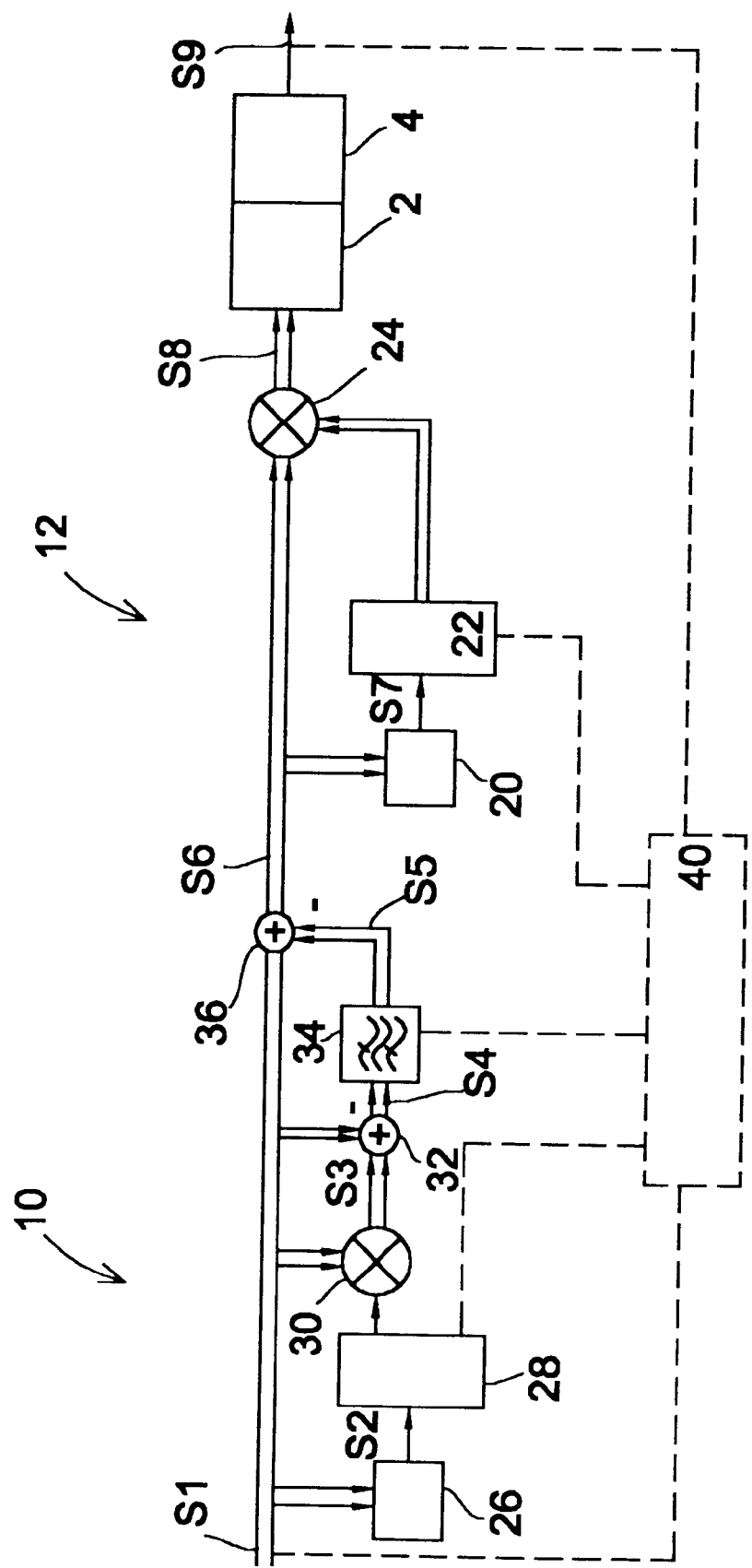
FIG. 1 shows a schematic block diagram of a first embodiment of an inventive circuit for reducing adjacent channel interference.

A circuit for reducing adjacent-channel interference by pre-linearizing and pre-distorting an input signal according to a first embodiment of the present invention is shown in FIG. 1 along with an upconverter 2 and a power amplifier 4 of a RF output stage. It is to be noted that the upconverter 2 comprises a digital-to-analog converter in case a digital input signal is applied thereto.

As can be seen from FIG. 1, the inventive circuit for reducing adjacent-channel interference comprises a pre-linearizing unit 10 and a pre-distorting unit 12. The pre-linearizing unit 10 and the pre-distorting unit 12 are connected in series, wherein the input of the pre-distorting unit is connected to the output of the pre-linearizing unit.

Before the pre-linearizing unit 10 is described in detail, reference is made to the pre-distorting unit 12. In principle, the pre-distorting unit 12 works like a prior art pre-distorting unit, as described, for example, in U.S. Pat. No. 5,049,832. In the pre-distorting unit 12, a complex output signal S8 is produced from a complex input signal S6 being the output signal of the pre-linearizing unit 10. The output signal S8 is produced according to the following equation:

$$S8(k)=S6(k) \cdot A(|S6(k)|^2)$$

In this equation, $A(|S6(k)|^2)$ represents the complex correction function which has to be applied to the signal S6(k) in order to compensate for the AM/AM and the AM/PM conversion of the non-linear channel. k is a running index indicating respective sample times. This non-linear function essentially depends on the amplitude of the input signal S6(k). The task to be solved by the pre-distorting unit 12 is to apply this complex function A to the signal S6(k) in a suitable manner so as to be able to suitably pre-distort the signal S6(k). Such a pre-distortion is known in the art and described, for example, in U.S. Pat. No. 5,049,832.

The pre-distorting unit 12 comprises an estimator 20 for determining an estimation signal S7 based on the power of the signal S6 input to the pre-distorting unit 12. In preferred embodiments of the present invention, the estimator 20 is a means for deriving the sum of squares of the magnitude of the real and imaginary parts of the signal S6, i.e., the squared magnitude thereof. Based on the estimation signal S7, a look-up table 22 is accessed. In the look-up table 22, complex pre-distortion coefficients are stored which represent the complex function A mentioned above. The complex pre-distortion coefficients depend on the amplitude of the input signal as well as on the properties of the non-linear power amplifier 4. The pre-distortion coefficients are complex numbers comprising a real part, i.e., an I component and an imaginary part, i.e., a Q component. The complex pre-distortion coefficients associated to the estimation signal S7 determined by the estimator 20 are used to carry out the pre-distortion of the signal S6 by multiplying this signal with the complex pre-distortion coefficients in a complex multiplier 24. The complex multiplier 24 comprises four multipliers in order to perform the complex multiplication. The signal S8 output by the multiplier 24 is applied to the combination of the upconverter 2 and the power amplifier 4, the non-linearities of which are compensated for by the inventive circuit for pre-linearizing and pre-distorting an input signal.

The pre-distortion coefficients which are stored in the look-up table means 22 and which are addressed in a suitable manner by the estimator 20 need not be constantly determined in real time, but are preferably calculated digitally before the circuit is put into operation or at specific calibration times. The complex pre-distortion coefficients are determined from the transmission characteristic of the non-linear channel, i.e., the power amplifier. The behaviour of the power amplifier can be characterized by the quotient of the distorted output signal and the input signal, according to magnitude and phase. On the basis of the transmission function of the power amplifier, estimated values for the AM/AM and the AM/PM characteristic of the non-linear power amplifier can then be calculated. The respective pre-distortion coefficients are then determined on the basis of the measured values and stored in the look-up table means accordingly.

Preferably, the complex pre-distortion coefficients stored in the look-up table provide for a section-wise linearization of the complex amplification, a complex pre-distortion coefficient being associated with each input signal power in a certain graduation. Thus, the non-linear amplification A is section-wise linearized, wherein the resolution, i.e., the number of linearizations in a specific power range, depends on the demands as well as on the available storage capacity of the look-up table means.

Alternatively, the complex pre-distortion coefficients can be determined as follows. The non-linearity of an amplifier can be estimated by recording the input signal and the output signal of the amplifier, compensating for time delays and phase shifts between the signals at the input and the output of the amplifier, associating all samples of the input signals with samples of the output signal, averaging respective input and output values in order to provide an AM/AM characteristic and an AM/PM characteristic having a number of respective checkpoints, for example 128, assessing the reliability of the checkpoints using standard deviations of magnitudes and phases, selecting checkpoints which are sufficiently reliable and interpolating the checkpoints assessed as sufficiently reliable in order to produce the AM/AM and AM/PM characteristics. Thus, a non-linear characteristic of an amplifier is estimated, wherein influences of measuring errors on the result of the estimation can be reduced. For determining the pre-distortion coefficients for the pre-distorting unit from the estimation of the non-linear characteristic of the power amplifier, the required inverse function can easily be obtained prior to the interpolation of the AM/AM characteristic and the AM/PM characteristic by exchanging the coordinates of the checkpoints, i.e., by exchanging input and output values.

The pre-distorting unit 12 provides for a pre-distortion of the input signal using the complex pre-distortion coefficients such that the distortion introduced by the non-linear power amplifier in the dynamic range thereof are substantially compensated for according to magnitude and phase. However, the pre-distorting unit 12 will not be able to reduce unwanted spurious emission (i.e., interfering signal portions) in the adjacent-channels in case the crest factor of the input signal exceeds the dynamic range of the power amplifier, i.e., the "back-off" thereof. Thus, in accordance with the present invention, the pre-linearizing unit 10 precedes the pre-distorting unit 12.

The pre-linearizing unit 10 receives an input signal S1 which is applied to an estimator 26 which produces an estimation signal S2 based on the power of the input signal S1. Preferably, the estimator 26 comprises means for deriving the sum of squares of the magnitude of the real and imaginary parts of the input signal S1, i.e., $|I^2+Q^2|$. Depending on the estimation signal S2, a look-up table 28 is accessed. Real coefficients are stored in the look-up table 28 which depend on the estimation signal S2 and the upper boundary of the dynamic range of the power amplifier. Within the dynamic range of the power amplifier, the real coefficients stored in the table 28 are constant greater than zero, and preferably are one. Differences from one in the values of the coefficients within the dynamic range of the power amplifier have to be scaled out by other elements in the output stage of the RF transmitter, the upconverter 2, for example. Beyond the dynamic range of the power amplifier, the real coefficients are chosen such that the magnitude of the signal output by a multiplication unit 30 remains on a constant value. The multiplication unit 30 is provided to multiply the real coefficient associated with a respective estimation signal S2 by the complex input signal S1. Thus, the multiplication unit is composed of two multipliers.

The combination of estimator 26, look-up table 28 and multiplier 30 represents a complex limiter forming a signal S3, the power of which is limited to the upper boundary of the dynamic range of the power amplifier 4. The upper limitation of the limiter is provided by the real coefficients of the look-up table 28. Again, the real coefficients of the look-up table 28 can be determined from the transmission characteristic of the power amplifier 4. Thus, the estimator 26, the table 28 and the multiplication unit 30 provide an estimation of the output signal which would be output by the power amplifier when fed with an input signal subjected to a pre-distortion by the pre-distorting unit 12. The power amplifier 4 and the pre-distorting unit 12 together form a soft limiter, i.e., an amplifier having a constant gain in the dynamic range thereof and a hard limitation beyond the dynamic range thereof. Therefore, the estimator 26, the table 28 and the multiplication unit 30 together form a limiter in order to imitate the output signal of the power amplifier 4 which is fed with a pre-distorted input signal.

The output signal S3 of the multiplication unit 30 will imitate the output signal of the power amplifier 4 in case a signal which has been subjected to a pre-distortion by the pre-distorting unit 12 is applied to the power amplifier 4. That is, the coefficients of the look-up table 28 can be determined from the transmission characteristic of the power amplifier while a pre-distortion by the pre-distorting unit 12 is conducted.

The signal S3, which represents a limited input signal, is combined with the input signal S1 using a combining means 32. The combining means 32 can either be an adder or a subtractor, dependent on the respective signs of the signals and the coefficients stored in the look-up table 28, respectively. In either case, the output signal S4 of the combining means 32, which can be referred to as a pre-linearization signal, reflects a signal portion of the input signal S1 exceeding the dynamic range of the power amplifier 4.

The pre-linearization signal S4 is applied to a time dispersive element 34, i.e., an element for expanding signal S4 in the direction of the time axis. In preferred embodiments of the present invention, the time dispersive element 34 comprises a bandpass filter or a lowpass filter. Thus, an expanded pre-linearization signal S5 is produced. The expanded pre-linearization signal S5 is combined with the input signal S1 using a further combining means 36 in order to produce the output signal S6 of the pre-linearizing unit 10 which is applied to the input of the pre-distorting unit 12. Again, the combining means 36 can be an adder or a subtractor, depending on the respective signs of the signals. In either case, an expanded version of the signal portion of the input signal exceeding the dynamic range of the power amplifier is subtracted from the input signal S1 using the combining means 36. The output S6 of the combining means 36 is the input to the pre-distorting unit 12.

Figure 2:
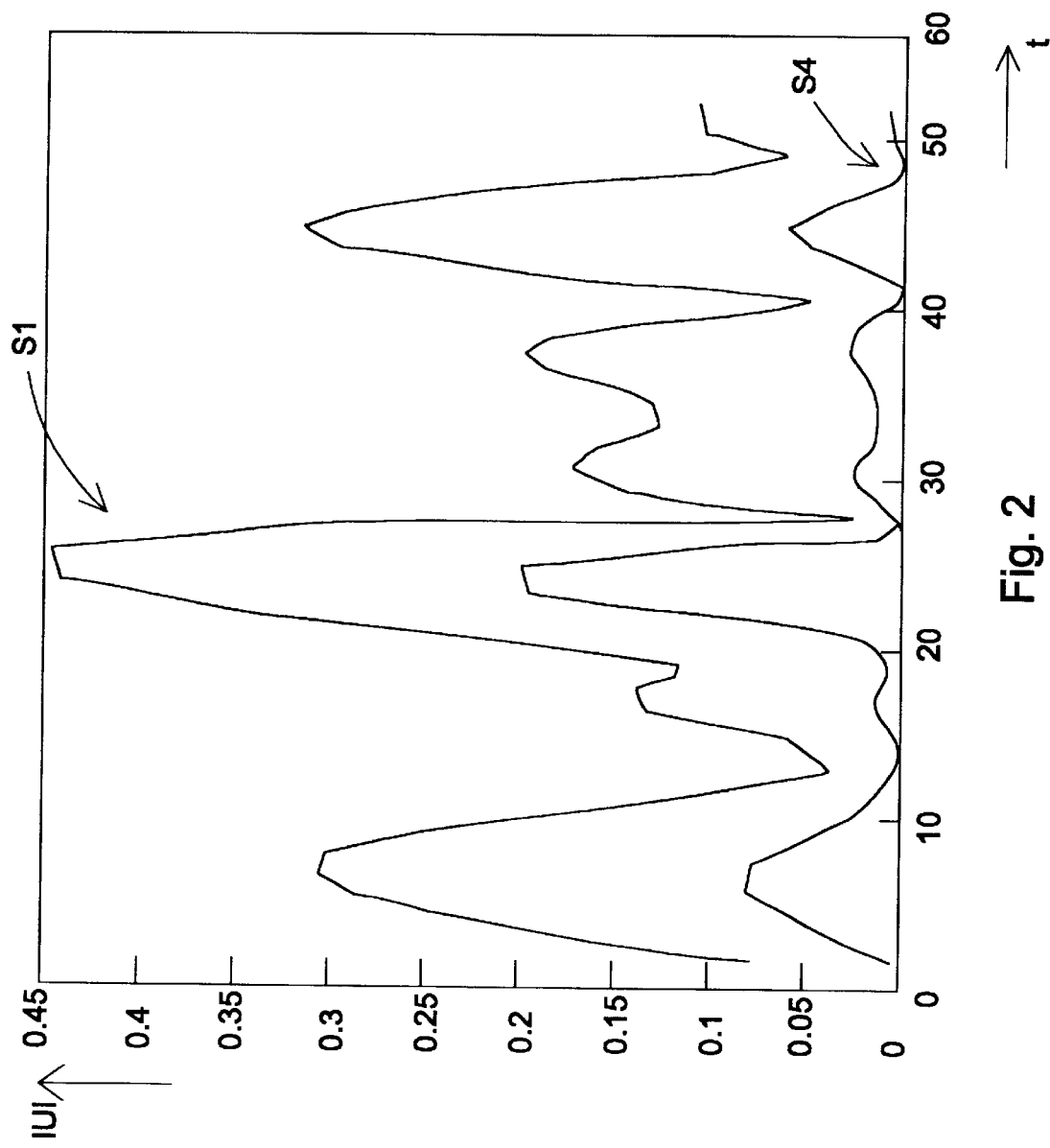
FIGS. 2 and 3 show graphs illustrating wave forms occurring inside the pre-linearizing unit of the inventive circuit for reducing adjacent-channel interference.

In the following, the mode of operation of the pre-linearizing unit 10 is described. In FIG. 2, a time chart is shown illustrating the wave form of the envelope U of a typical multi-carrier signal representing the input signal S1. The labelling of the abscissa, the time axis, refers to sample values. The labelling of the ordinate refers to the amplitude |U| of the input signal S1. It is to be noted at this point that it does not make any difference as to whether the amplitude or the squared magnitude of the input signal is recorded in the direction of the ordinate, since both the amplitude and the squared magnitude are measures for the power of the input signal. In addition, FIG. 2 shows the wave form of the signal S4 representing the pre-linearization signal, i.e., the signal portion of the input signal S1 exceeding the dynamic range of the power amplifier.

Figure 3:
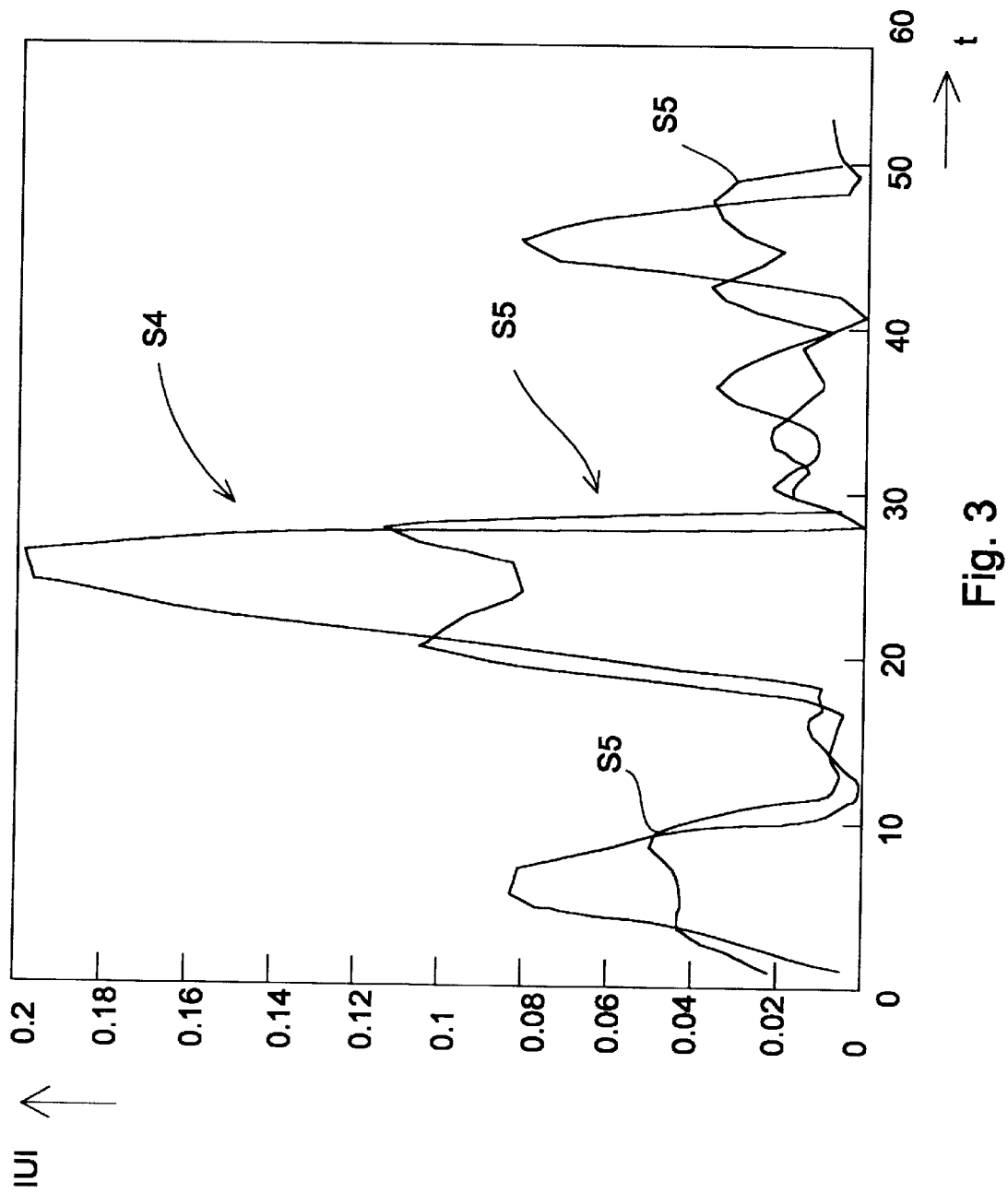

FIG. 3, the ordinate of which uses a different scale when compared with FIG. 2, shows the pre-linearization signal S4 and the expanded pre-linearization signal S5 produced by the expansion of the pre-linearization signal S4 in the direction of the time axis using the time dispersive element 34. The expanded pre-linearization signal S5 is subtracted from the input signal S1. Using the expanded pre-linearization signal in order to pre-linearize the input signal S1 results in a shifting of spurious emission in the output signal of the power amplifier away from the channels adjacent to the useful channel towards more distant channels. The pure limitation of the input signal to the dynamic range of the power amplifier would not result in an adequate reduction of interfering signal portions due to spurious adjacent-channel emission due to the complex nature of the input signal and the signal edges produced by hardly limiting the input signal to the dynamic range of the power amplifier. Thus, according to the present invention, the time dispersive element 34 is provided in the pre-linearizing unit 10.

In preferred embodiments of the present invention, the time dispersive element 34 is a bandpass filter or a lowpass filter. The filter coefficients of both the bandpass filter and the lowpass filter, respectively can be determined from the transmission characteristic of the power amplifier in advance by measuring the spectral power of the output signal of the power amplifier and by using the power in the channels adjacent to the useful channel as criteria for optimizing the filter coefficients. For such an optimization, known algorithms, for example, a simplex algorithm, can be used. As with the real coefficients of the look-up table 28, the filter coefficients of the time dispersive filter 34 are preferably determined while a pre-distortion using the pre-distorting unit 12 is conducted.

The real coefficients of table 28 are preferably determined while the pre-linearization means is inactive. Similarly, the filter coefficients of the time dispersive filter 34 are preferably determined while the pre-linearizing unit 10 is inactive or, at least, the time dispersive filter is inactive. Thus, a bypass of the time dispersive filter 34 can be provided.

As has already been mentioned, the pre-distortion coefficients stored in table 22, the coefficients stored in table 28 and the filter coefficients of the time dispersive filter 34 are determined when the circuit is not in operation, for example, when the circuit is being produced or put into operation. In order to be able to carry out a fine adjustment at certain times during the operation of the inventive circuit, an adapting means 40 can optionally be provided which compares the input signal S1 and the output signal of the power amplifier S9 so as to find out whether a linear relationship, such as a simple amplification, exists between these two signals. If such a linear relationship does not exist, this indicates that ambient conditions have changed and that the coefficients in tables 22 and 28 and/or the filter coefficients of the time dispersive filter 34, which is preferably a digital filter, are therefore no longer optimally adjusted. In a recalibration step, the adapting means suitably modifies the coefficients and/or filter coefficients in order to compensate for such changed ambient conditions, due to ageing of the power amplifier, temperature changes, supply voltage variations, channel switches, changed operation points and the like. To this end, the adapting means 40 is in communication with the input line carrying the input signal S1, the output of the power amplifier 4, the look-up tables 22 and 28 and the time dispersive element 34.

In order to take into account predetermined delay times of the pre-linearizing unit and the pre-distorting unit, appropriate delay elements can be provided in the signal path of the input signal S1 via the combining means 36 and the pre-distorter 24 to the upconverter 2. The delay time of the pre-linearization of the pre-distortion according to the present invention is determined from the outset and does not depend on parameters of any kind, since the pre-distortion is preferably synchronized by an external clock. Hence, the delay time can be compensated for in a simple and valuable manner.

Figure 4:
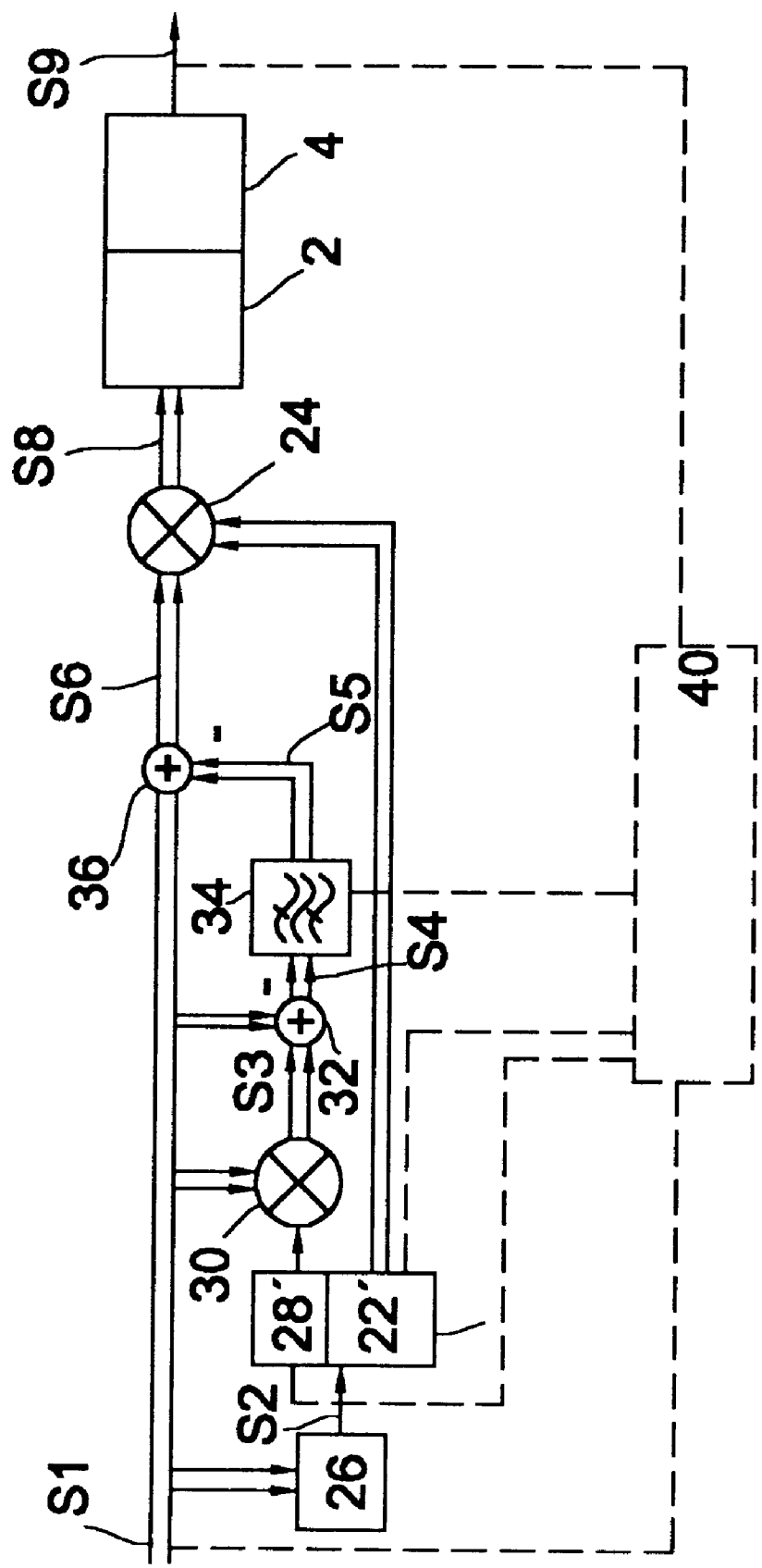
FIG. 4 shows a schematic block diagram of a second embodiment of an inventive circuit for reducing adjacent-channel interference.

A second embodiment of an inventive circuit for reducing adjacent-channel interference by pre-linearizing and pre-distorting an input signal to be transmitted via a power amplifier is shown in FIG. 4. Components that are identical in FIGS. 1 and 4 are designed by identical reference numerals. In connection with FIG. 4, only differences between the circuits shown in FIGS. 1 and 4 are described hereinafter.

As can be seen from FIG. 4, only one estimator 26 is used in order to produce an estimation signal based on the power of the input signal S1. The estimation signal is used to access both a real coefficient look-up table 28' and a complex coefficient table 22'. The real coefficient look-up table 28' is used in the pre-linearizing unit of FIG. 4, which is composed of the elements 26, 28', 30, 32, 34 and 36. The complex coefficient look-up table 22' is used in the pre-distorting unit shown in FIG. 4, which is composed of elements 26, 22' and 24. Thus, the embodiment shown in FIG. 4 represents a "interleaved" version of the pre-linearizing unit 10 and the pre-distorting unit 12 shown in FIG. 1.

According to the embodiment shown in FIG. 4, the look-up table 22' is accessed depending on an estimation signal which is based on the power of the input signal S1, rather than an estimation signal which is based on the power of the pre-linearized signal S6, as in the embodiment of FIG. 1. This approximation reduces the linearization gain achieved by the pre-distorting unit. However, even a highly non-linear power amplifier 4 is still adequately linearized by additionally utilizing the effect of the pre-linearizing unit comprising the time dispersive element.

Using the above approximation, only one estimator is required, contrary to the circuit shown in FIG. 1 in which two estimators 20 and 26 are provided. If a unit for forming the squared magnitude of the complex input signal is used, four multipliers are saved due to saving a second estimator.

With the present invention, the coefficients of the look-up tables 22 and 22' can be chosen such that over-driving of the power amplifier can be limited at the input side in order to avoid damages and overload.

Figure 5:
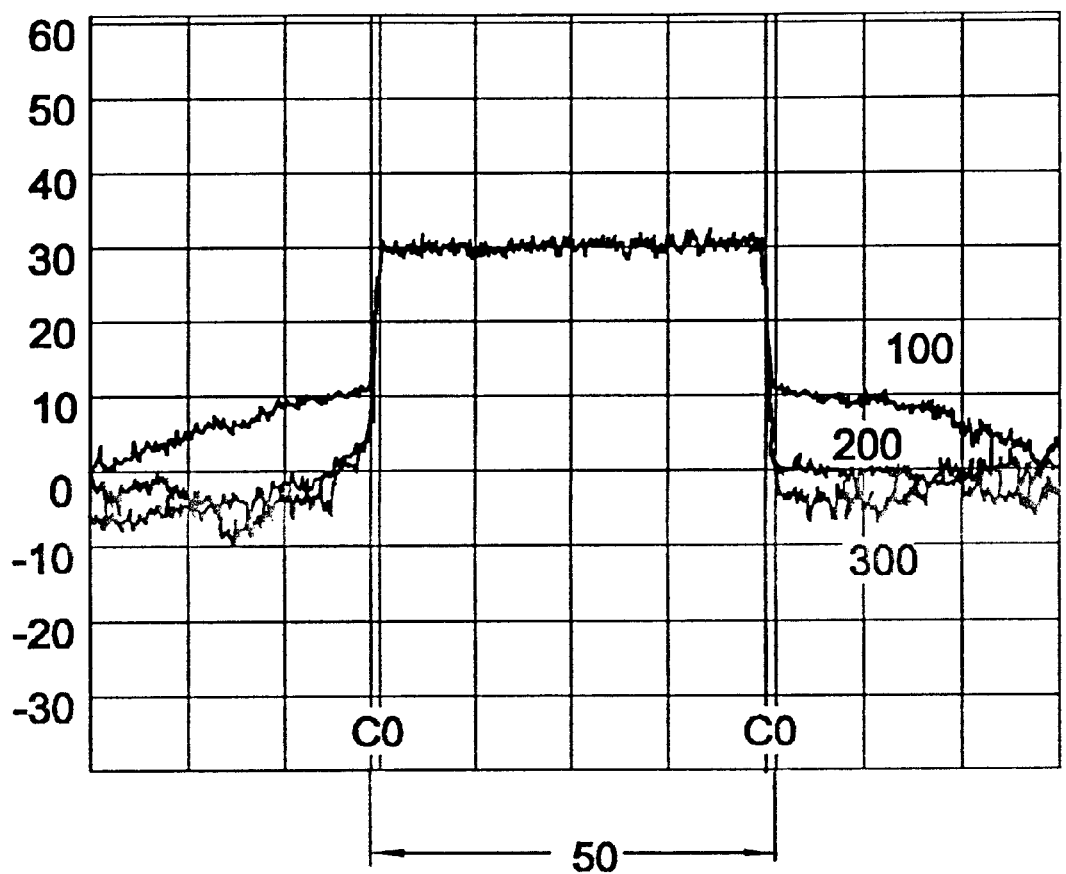
FIG. 5 shows power spectra at the output of a power amplifier.

FIG. 5 shows three frequency spectra at the output of a travelling wave tube. The frequency spectrum 100 is obtained with an input signal which has not been subjected to any pre-linearization or pre-distortion. The frequency spectrum 200 is obtained with an input signal which has been subjected to a pre-distortion using a pre-distorting unit 12. Finally, the frequency spectrum 300 has been obtained using an input signal which has been pre-linearized and pre-distorted making use of the inventive circuit shown in FIG. 4. As can be seen from FIG. 5, the spurious emission in the channels adjacent to the useful channel 50 is reduced when using the inventive circuit as compared with the frequency spectrum 200 using a pre-distortion only.

Figure 6:
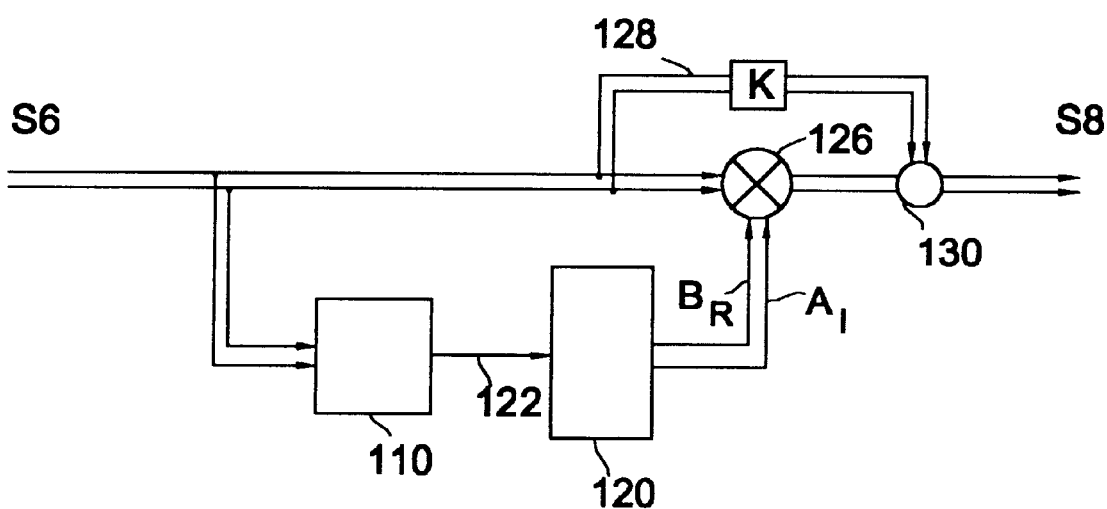
FIG. 6 shows a schematic view of an alternative pre-distorting unit which can be used with the present invention.

FIG. 6 shows a schematic view of an alternative pre-distorting unit which can be used with the present invention and which permits usage of a look-up table having a reduced size for storing complex pre-distortion coefficients. For the real part, $A_R$ of the complex pre-distortion coefficients, the following relation applies:

$$(1-a) < A_R < (1+a).$$

For the imaginary part $A_I$ of the complex pre-distortion coefficients, the following equation applies:

$$-b < A_I < b.$$

Thus, $A_R$ accepts values in a range adjacent to one, whereas $A_I$ accepts values in a range adjacent to zero. Having the above relations in mind, the inventors recognized that a look-up table having a reduced word length can be used in case $A_R-K$ is stored in the look-up table rather than $A_R$, wherein K is a constant with $0<K<2$. Due to the range of values of the real coefficient $A_R$ mentioned above, best result will be achieved in case the constant K is set to be one. However, a reduction of the word length can be achieved as long as K is chosen to be greater than 0 and not greater than 2.

Thus, $B_R=A_R-K$ is stored as the real pre-distortion coefficients in the look-up table.

This modification of the stored real coefficient has to be compensated for in the pre-distorter which is coupled with the input signal and the look-up table. Therefore, the pre-distortion conducted by the pre-distorting unit has to meet the following equation:

$$S8(k)=(Re\{S6(k)\}+jIm\{S6(k)\}) \cdot (1+B_R(n)+jA_I(n))$$

wherein $n=f(S6(k))$.

A pre-distorting unit for obtaining a pre-distortion as defined above is shown in FIG. 6. A complex input signal $S6(k)$, an OFDM signal, for example, is a complex digital signal having a running index k in the embodiment shown in FIG. 6. In accordance with the pre-distorting unit shown in FIG. 6, the input signal $S6(k)$ is applied to an estimator 110 for determining an estimation signal based on the power of the input signal $S6(k)$.

The estimator 110 is connected to a look-up table 120 in which complex pre-distortion coefficients $B_R(f(S6(k)))$ and $A_I(f(S6(k)))$ are stored. As it has been explained hereinbefore, the coefficient $B_R$ is obtained from the real pre-distortion coefficient $A_R$ used in prior art pre-distorters by subtracting K according to $B_R=A_R-K$. In the preferred embodiments of the present invention, the constant K is set to be one.

The look-up table 120 is accessed on the basis of the estimation signal 122 determined by the estimator 110 in order to apply the pre-distortion coefficients $B_R$ and $A_I$ to a pre-distorter 24. In addition, the input signal $S6(k)$ is applied o the pre-distorter 24. A pre-distortion according to $$S8(k)=(Re\{S6(k)\}+jIm\{S6(k)\}) \cdot (1+B_R(n)+jA_I(n))$$

wherein $n=f(S6(k))$, is performed in the pre-distorting unit in order to produce a pre-distorted signal $S8(k)$ to be applied to the output stage, i.e., the power amplifier. To this end, the pre-distorting unit comprises a multiplication unit 126 and a bypass path 128 for bypassing the multiplication unit 126, wherein the bypass path 128 is provided in order to multiply the input signal $S6(k)$ by the constant K. In the preferred embodiment of the present invention, the constant K is set to be one and therefore the bypass 128 is a single bridge between the input of the multiplication unit 128 and the output thereof. A combining unit 130 is provided in order to combine the output of the multiplication unit 126 and the output of the bypass path 128. Thus, the pre-distorted input signal $S8(k)$ is obtained according to the equation mentioned above.

Although preferred embodiments of the present invention have been described above with respect to complex digital input signals, the present invention is usable with analog input signals as well. In such a case, quantization means which form quantized envelope values, said values being formed dependent on the envelope of the input signal, which is detected by an envelope detector, can be used. A suitable part of the input signal, which is required for detecting the envelope, can be taken from the main signal path in a manner known to those skilled in the art, e.g., by means of a directional coupler. In addition, digital-to-analog converters and IQ modulators can be provided in order to apply the respective coefficients to the respective analog signals.

What is claimed is:

1. A circuit for reducing adjacent-channel interference by pre-linearizing and pre-distorting an input signal to be transmitted via a power amplifier having a non-linear transmission characteristic and a limited dynamic range, comprising:

a pre-linearization signal generator for producing a pre-linearization signal reflecting a signal portion of said input signal exceeding the dynamic range of said power amplifier;

an element for expanding said pre-linearization signal along the time axis to produce an expanded pre-linearization signal reflecting an expanded version of said signal portion of said input signal exceeding said limitation;

a combiner for combining said expanded pre-linearization signal and said input signal, such that said expanded version of said signal portion of said input signal exceeding said limitation is subtracted from said input signal, to produce a pre-linearized signal;

a pre-distorting unit for pre-distorting said pre-linearized signal using complex pre-distortion coefficients which depend on the power of said input signal or the power of said pre-linearized signal and the non-linear transmission characteristic of said power amplifier determined in advance, such that the distortion introduced by the non-linear transmission characteristic of said power amplifier is substantially compensated for according to magnitude and phase.

2. A circuit according to claim 1, wherein said pre-linearization signal generation unit comprises:

a limiter having an upper limitation for producing a limited input signal on the basis of said input signal, the upper limitation of said limiter corresponding to the upper boundary of the dynamic range of said power amplifier; and a combiner for combining said limited input signal and said input signal to produce said pre-linearization signal.

3. A circuit according to claim 1, wherein said pre-distorting unit comprises:

an estimator for determining an estimation signal based on the power of said pre-linearized signal;

a table for storing said complex pre-distortion coefficients, wherein said complex pre-distortion coefficients depend on the power of said pre-linearized signal and the non-linearity of said power amplifier; and a pre-distorter for applying said complex pre-distortion coefficients to said pre-linearized signal.

4. A circuit according to claim 2, wherein said pre-distorting unit comprises:

an estimator for determining an estimation signal based on the power of said input signal;

a table for storing said complex pre-distortion coefficients, wherein said complex pre-distortion coefficients depend on the power of said input signal and the non-linearity of said power amplifier; and a pre-distorter for applying said complex pre-distortion coefficients to said pre-linearized signal.

5. A circuit according to claim 2, wherein said limiter comprises:

an estimator for determining an estimation signal based on the power of said input signal;

a table for storing real coefficients, wherein the real coefficients depend on the power of said input signal and the upper boundary of the dynamic range of the power amplifier; and an element for applying the real coefficients to the input signal such that the limited input signal is produced.

6. A circuit according to claim 5, wherein said pre-distorting unit comprises:

an estimator for determining an estimation signal based on the power of said input signal;

a table for storing said complex pre-distortion coefficients, wherein said complex pre-distortion coefficients depend on the power of said input signal and the non-linearity of said power amplifier; and a pre-distorter for applying said complex pre-distortion coefficients to said pre-linearized signal, and wherein one estimator for determining an estimation signal based on the power of said input signal is shared by said pre-linearization signal generator and said pre-distorting unit.

7. A circuit according to claim 3, wherein said respective estimator comprises means for deriving the sum of squares of the magnitude of the real and imaginary parts of the respective signal.

8. A circuit according to claim 3, wherein said pre-distorter comprises a complex multiplier for multiplying said complex pre-distortion coefficients by said pre-linearized signal.

9. A circuit according to claim 1, wherein said element for expanding said pre-linearization signal along the time axis is a bandpass filter or a lowpass filter.

10. A circuit according to claim 3, further comprising an adaptor for adapting the coefficients of said table or said tables to take into account changes of the transmission characteristics of the power amplifier.

11. A circuit according to claim 9, wherein filter coefficients of said bandpass filter or said lowpass filter are determined based on the transmission characteristic of the power amplifier in advance.

12. A circuit according to claim 11, further comprising an adaptor for adapting the coefficients of said table or said tables and/or said filter coefficients of said bandpass filter or said lowpass filter to take into account changes of the transmission characteristics of said power amplifier.

13. A method for reducing adjacent-channel interference by pre-linearizing and pre-distorting an input signal to be transmitted via a power amplifier having a non-linear transmission characteristic and a limited dynamic range, comprising the steps of:

producing a pre-linearization signal reflecting a signal portion of said input signal exceeding the dynamic range of said power amplifier;

expanding said pre-linearization signal along the time axis to produce an expanded pre-linearization signal reflecting an expanded version of said signal portion of said input signal exceeding said limitation;

combining said expanded pre-linearization signal and said input signal, such that said expanded version of said signal portion of said input signal exceeding said limitation is subtracted from said input signal, to produce a pre-linearized signal;

pre-distorting said pre-linearized signal using complex pre-distortion coefficients which depend on the power of said input signal or the power of said pre-linearized signal and the non-linear transmission characteristic of said power amplifier determined in advance, such that the distortion introduced by the non-linear transmission characteristic of the power amplifier is substantially compensated for according to magnitude and phase.

14. A method according to claim 13, wherein said step of producing said pre-linearization signal comprises the steps of:

producing a limited input signal on the basis of said input signal by limiting said input signal to an upper limitation, said upper limitation corresponding to the upper boundary of the dynamic range of the power amplifier; and combining said limited input signal and said input signal to produce said pre-linearization signal.

15. A method according to claim 13, wherein said step of pre-distorting comprises the steps of:

determining an estimation signal based on the power of said pre-linearized signal;

accessing, on the basis of said estimation signal, a table storing said complex pre-distortion coefficients, wherein said complex pre-distortion coefficients depend on the power of said pre-linearized signal and the non-linear transmission characteristic of said power amplifier; and applying said complex pre-distortion coefficients to said pre-linearized signal.

16. A method according to claim 14, wherein said step of pre-distorting comprises the steps of:

determining an estimation signal based on the power of said input signal;

accessing, on the basis of said estimation signal, a table storing said complex pre-distortion coefficients, wherein said complex pre-distortion coefficients depend on the power of said input signal and the non-linear transmission characteristic of said power amplifier; and applying said complex pre-distortion coefficients to said pre-linearized signal.

17. A method according to claim 14, wherein said step of producing said limited input signal comprises the steps of:

determining an estimation signal based on the power of said input signal;

accessing, on the basis of said estimation signal, real coefficients stored in a table, wherein the real coefficients depend on the power of said input signal and the upper boundary of the dynamic range of said power amplifier, and applying the real coefficients to the input signal to produce said limited input signal.

18. A method according to claim 17, wherein said step of pre-distorting comprises the steps of:

determining an estimation signal based on the power of said input signal;

accessing, on the basis of said estimation signal, a table storing said complex pre-distortion coefficients, wherein said complex pre-distortion coefficients depend on the power of said input signal and the non-linear transmission characteristic of said power amplifier; and applying said complex pre-distortion coefficients to said pre-linearized signal, and wherein one estimator for determining an estimation signal based on the power of said input signal is shared for said step of producing said limited input signal and for said step of pre-distorting.

19. A method according to claim 15, wherein said respective steps of determining an estimation signal comprises the step of deriving the sum of squares of the absolute value of the real and imaginary parts of the respective signal.

20. A method according to claim 13, wherein said step of pre-distorting comprises the step of complex multiplying said complex pre-distortion coefficients by said pre-linearized signal.

21. A method according to claim 13, wherein said step of producing said expanded pre-linearization signal comprises the step of passing said pre-linearization signal through a bandpass filter or a lowpass filter.

22. A method according to claim 15, further comprising the step of adapting the coefficients of said table or said tables to take into account changes of the transmission characteristics of said power amplifier.

23. A method according to claim 21, further comprising the step of determining filter coefficients of said bandpass filter or said lowpass filter based on the transmission characteristics of said power amplifier.

24. A method according to claim 23, further comprising the step of adapting the coefficients of said table or said tables and/or said filter coefficients of said bandpass filter or said lowpass filter to take into account changes of the transmission characteristics of said power amplifier.

* * * * *